US011424318B2

(12) United States Patent
Hu et al.

(10) Patent No.: US 11,424,318 B2
(45) Date of Patent: Aug. 23, 2022

(54) CAPACITOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Lianfeng Hu, Shanghai (CN); Youcun Hu, Shanghai (CN); Ming Yang, Shanghai (CN); Duohui Bei, Shanghai (CN); Baibing Ni, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/538,100

(22) Filed: Aug. 12, 2019

(65) Prior Publication Data

US 2020/0105865 A1    Apr. 2, 2020

(30) Foreign Application Priority Data

Sep. 28, 2018  (CN) .......................... 201811141437.1

(51) Int. Cl.
*H01L 49/02*  (2006.01)
*H01L 21/285*  (2006.01)
*H01L 21/02*  (2006.01)

(52) U.S. Cl.
CPC ............. *H01L 28/84* (2013.01); *H01L 28/75* (2013.01); *H01L 21/02266* (2013.01); *H01L 21/2855* (2013.01); *H01L 21/28556* (2013.01)

(58) Field of Classification Search
None
See application file for complete search history.

(56) References Cited

U.S. PATENT DOCUMENTS 6,054,328 A * 4/2000 Duncombe ....... H01L 21/02197
438/3
7,018,893 B1 * 3/2006 Kundalgurki ..... H01L 27/10852
257/303

(Continued)

FOREIGN PATENT DOCUMENTS

CN          106128939 A  * 11/2016

*Primary Examiner* — Andres Munoz
(74) *Attorney, Agent, or Firm* — Anova Law Group, PLLC

(57) ABSTRACT

A method for fabricating a capacitor device includes providing a substrate; forming a first-layer electrode on the substrate; and forming a conductive layer on the first-layer electrode. The roughness of the first-layer electrode is a first roughness, the roughness of the conductive layer is a second roughness, and the second roughness is smaller than the first roughness. The method further includes forming a dielectric layer on the conductive layer; and forming a second-layer electrode on the dielectric layer. According to the disclosed method and capacitor device, by forming the conductive layer on the first-layer electrode, the roughness of the bottom electrode of the capacitor device is reduced, which effectively reduces the presence of protrusions on the surface of the bottom electrode. Therefore, the breakdown electric voltage of the capacitor device may be improved, and leakage current may be avoided. As such, the reliability of the capacitor device may be improved.

11 Claims, 3 Drawing Sheets

(56) References Cited

U.S. PATENT DOCUMENTS

| | | | |
|---|---|---|---|
| 2002/0037624 A1* | 3/2002 | Mori | H01L 28/60 |
| | | | 438/396 |
| 2003/0064604 A1* | 4/2003 | Umeda | H01L 21/31691 |
| | | | 438/745 |
| 2004/0097034 A1* | 5/2004 | Sandhu | H01L 28/56 |
| | | | 438/243 |
| 2005/0062130 A1* | 3/2005 | Ciancio | H01L 23/5223 |
| | | | 257/532 |
| 2012/0049369 A1* | 3/2012 | Mitsuyama | H01L 21/76883 |
| | | | 257/751 |
| 2020/0105865 A1* | 4/2020 | Hu | H01L 28/75 |

* cited by examiner

CAPACITOR DEVICES AND FABRICATION METHODS THEREOF

CROSS-REFERENCES TO RELATED APPLICATIONS

This application claims the priority of Chinese Patent Application No. CN201811141437.1, filed on Sep. 28, 2018, the entire content of which is incorporated herein by reference.

FIELD OF THE DISCLOSURE

The present disclosure generally relates to the field of semiconductor fabrication technology and, more particularly, relates to capacitor devices and fabrication methods thereof.

BACKGROUND

In today's very large scale integration (VLSI), capacitors are commonly used passive devices. Generally speaking, analog capacitors have been switched from polysilicon-insulator-polysilicon (PIP) to metal-insulator-metal (MIM) because in analog RF circuits, capacitors with a larger capacitance density are needed.

One of the methods for increasing the capacitance density is to reduce the thickness of the dielectric layer. However, an overly small thickness of the dielectric layer may result in an excessively high electric field, and thus cause leakage current and lower the breakdown voltage. Capacitors with a high-k metal-insulator-metal (HK MIM) structure demonstrate good application prospects due to their high unit capacitance density.

However, a capacitor with the HK MIM structure formed by existing technology may easily cause leakage current and lower the breakdown voltage during operation, and thus may reduce the reliability of the MIM capacitor. The disclosed capacitor devices and fabrication methods thereof are directed to solve one or more problems set forth above and other problems in the art.

BRIEF SUMMARY OF THE DISCLOSURE

One aspect of the present disclosure provides a method for fabricating a capacitor device. The method includes providing a substrate; forming a first-layer electrode on the substrate; and forming a conductive layer on the first-layer electrode. The roughness of the first-layer electrode is a first roughness, the roughness of the conductive layer is a second roughness, and the second roughness is smaller than the first roughness. The method further includes forming a dielectric layer on the conductive layer; and forming a second-layer electrode on the dielectric layer.

Another aspect of the present disclosure provides a capacitor device. The capacitor device includes a substrate; a first-layer electrode formed on the substrate; and a conductive layer formed on the first-layer electrode. The roughness of the first-layer electrode is a first roughness, the roughness of the conductive layer is a second roughness, and the second roughness is smaller than the first roughness. The capacitor device further includes a dielectric layer formed on the conductive layer; and a second-layer electrode formed on the dielectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
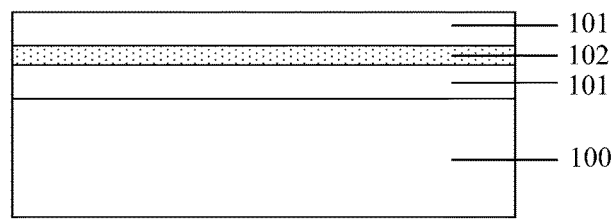
FIG. 1 illustrates a schematic view of a capacitor device.

FIG. 1 illustrates a schematic view of a capacitor device. Referring to FIG. 1, the capacitor device includes a substrate 100, a first-layer electrode 101 formed on the substrate 100, a dielectric layer 102 formed on the surface of the first-layer electrode 101, and a second-layer electrode 103 formed on the surface of the dielectric layer 102.

The first-layer electrode 101 and the second-layer electrode 103 are both made of a metal nitride, including titanium nitride, tantalum nitride, copper nitride, tungsten nitride, platinum nitride, aluminum nitride, nickel nitride, cobalt nitride, etc. The first-layer electrode 101 and the second-layer electrode 103 formed by a metal nitride demonstrate desired electrical performance and high reliability. In the capacitor device described above, the first-layer electrode 101 serves as a bottom electrode, and the second-layer electrode 103 serves as a top electrode. The dielectric layer 102 is located between the bottom electrode and the top electrode. The thickness of the dielectric layer 102 is small, that is, the distance between the bottom electrode and the top electrode is small, thereby conducive to improving the capacitance density of the formed capacitor device. However, because the first-layer electrode 101 is made of a metal nitride, due to the limitation of the crystal orientation of the material, the surface of the first-layer electrode 101 may be rough, e.g., protrusions may be present on the surface of the first-layer electrode 101. Therefore, when the distance between the first-layer electrode 101 and the second-layer electrode 103 is small, electric fields with excessively high strength are easily formed at the protrusions on the top surface of the first-layer electrode 101, causing the device to break down at the protrusions of the first-layer electrode 101. Therefore, a leakage current may be generated and the reliability of the formed capacitor device may be undesired.

The present disclosure provides a method for fabricating a capacitor device. According to the disclosed method, a first-layer electrode with a first roughness is formed on a substrate, and then a conductive layer with a second roughness that is smaller than the first roughness is formed on the first-layer electrode. Therefore, the surface of the conductive layer is smoother than the surface of the first-layer electrode. The disclosed method may be conducive to planarizing the first-layer electrode to remove the protrusions on the top surface of the first-layer electrode. Therefore, the disclosed method is conducive to improving the reliability of the formed capacitor device.

Figure 8:
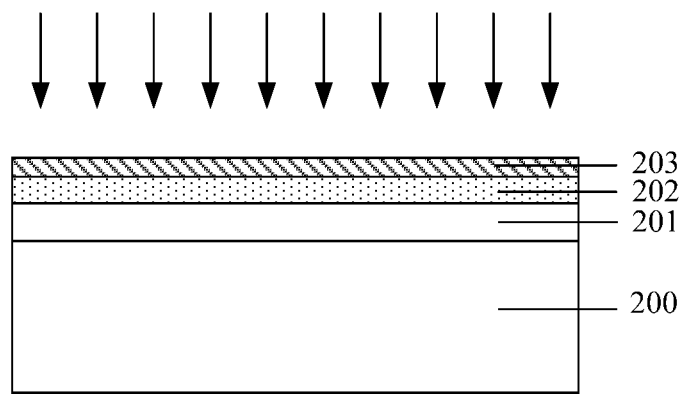
Figure 9:
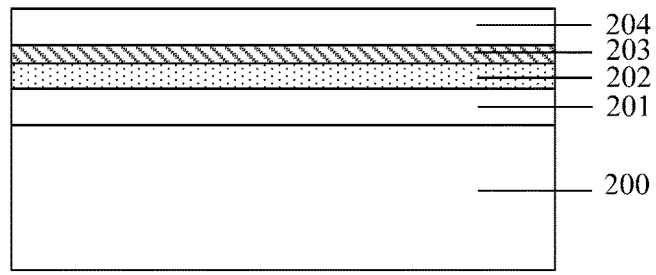
Figure 10:
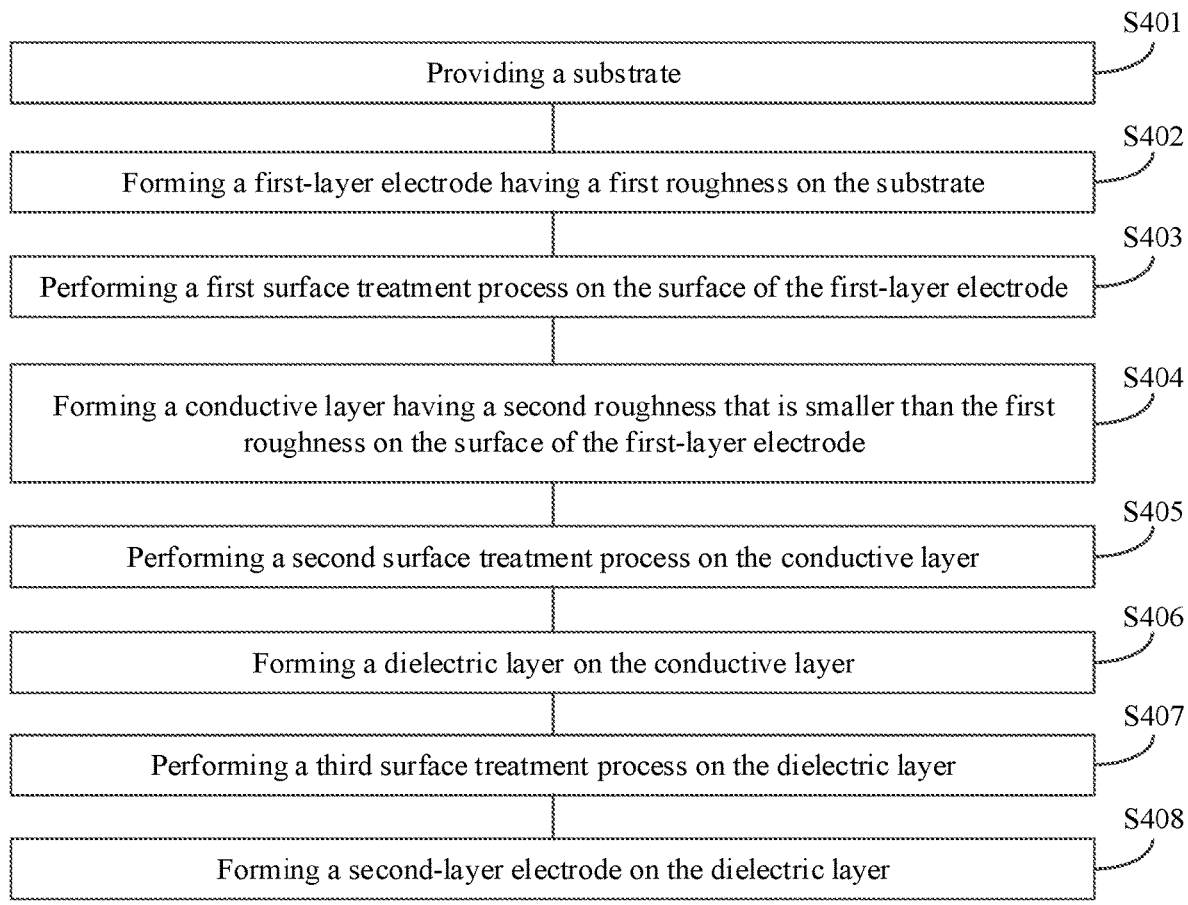
FIG. 10 illustrates a flowchart of an exemplary method for fabricating a capacitor device consistent with various embodiments of the present disclosure.

FIG. 10 illustrates a flowchart of an exemplary method for fabricating a capacitor device consistent with various embodiments of the present disclosure, and FIGS. 2-9 illustrate schematic views of semiconductor structures at certain stages of the exemplary method.

Figure 2:
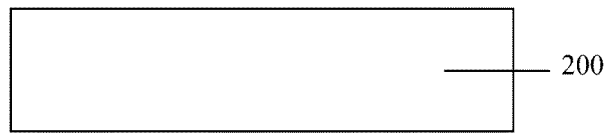
FIGS. 2-9 illustrate schematic views of semiconductor structures at certain stages of an exemplary method for fabricating a capacitor device consistent with some embodiments of the present disclosure.

Referring to FIG. 10, a substrate may be provided (S401). FIG. 2 illustrates a schematic cross-sectional view of a semiconductor structure consistent with various embodiments of the present disclosure.

Referring to FIG. 2, a substrate 200 may be provided. In one embodiment, the substrate 200 may be a substrate formed after a front end of the line (FEOL) process during the manufacturing of the chip. The substrate 200 may thus include basic semiconductor devices (not shown), such as complementary metal-oxide-semiconductor (CMOS) transistors, etc., formed in the FEOL process.

In other embodiment, the substrate may further experience a back end of the line (BEOL) process. Therefore, the substrate may also include a plurality of through holes, a plurality of metal interconnection lines, an interlayer dielectric layer, etc. that are formed through the BEOL process. The first-layer electrode deposited on the substrate may be electrically connected to the semiconductor devices in the substrate through the plurality of through holes and a plurality of contact holes. Alternatively, the substrate may include an oxide layer, an etch stop layer formed on the oxide layer, and another oxide layer formed on the top surface of the etch stop layer.

Figure 3:
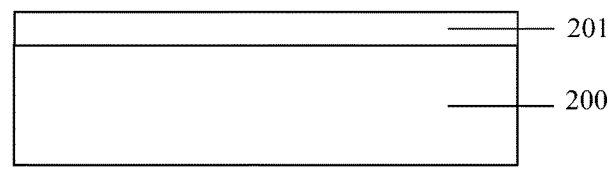

Further, returning to FIG. 10, a first-layer electrode having a first roughness may be formed on the substrate (S402). FIG. 3 illustrates a schematic cross-sectional view of a semiconductor structure consistent with various embodiments of the present disclosure.

Referring to FIG. 3, a first-layer electrode 201 may be formed on the substrate 200, and the first-layer electrode 201 may have a first roughness.

The first-layer electrode 201 may be made of a metal nitride. For example, the first-layer electrode 201 may be made of titanium nitride, tantalum nitride, copper nitride, tungsten nitride, platinum nitride, aluminum nitride, nickel nitride, or cobalt nitride. The first-layer electrode 201 made of a metal nitride may demonstrate desired electrical performance, and thus the subsequently-formed capacitor device may have desired reliability. In one embodiment, the first-layer electrode 201 may be made of titanium nitride.

In one embodiment, the deposition process of the first-layer electrode 201 may include an atomic layer deposition (ALD) process, a plasma chemical vapor deposition (PCVD) process, a low-pressure chemical vapor deposition (LPCVD) process, a sputtering deposition process, an ion beam deposition process, an ion-beam assisted deposition process, etc.

The thickness of the first-layer electrode 201 may not be too large or too small. For example, when the thickness of the first-layer electrode 201 is larger than 1000 Å, the overall thickness of the formed capacitor device may be too large, which is not conducive to the subsequent integration process. However, when the thickness of the first-layer electrode 201 is smaller than 100 Å, device breakdown may likely take place, such that a leakage current may be generated and the reliability of the formed capacitor device may be undesired. Therefore, in one embodiment, the thickness of the first-layer electrode 201 may be in a range of approximately 100 Å to 1000 Å.

Figure 4:
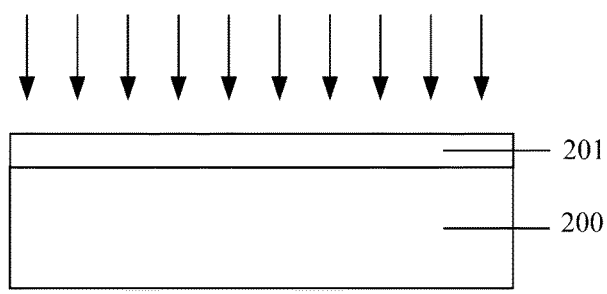

Further, returning to FIG. 10, after forming the first-layer electrode, a first surface treatment process may be performed on the surface of the first-layer electrode (S403). FIG. 4 illustrates a schematic diagram of performing the first surface treatment process consistent with various embodiments of the present disclosure.

Referring to FIG. 4, after forming the first-layer electrode 201, a first surface treatment process may be performed. Performing the first surface treatment process may include performing a cleaning process; and after the cleaning process, performing an inert-gas treatment process. The cleaning process includes one or a combination of a wet cleaning process and a dry cleaning process In one embodiment, the cleaning process may be a wet cleaning process. The process parameters of the wet cleaning process may include using deionized water, e.g., deionized water may be used for performing the wet cleaning process.

In one embodiment, the inert-gas treatment process may be a hot nitrogen treatment process.

During the first surface treatment process, after performing the wet cleaning process using deionized water, the impurities on the surface of the first-layer electrode 201 may be effectively removed. Further, following the wet cleaning process, the inert-gas treatment process using hot nitrogen may be performed. The surface of the first-layer electrode 201 may be able to quickly dry in the hot nitrogen environment. The first surface treatment process may be conducive to preventing contamination on the surface of the first-layer electrode 201, and thus may further prevent degradation of the electrical performance of the first-layer electrode 201. In addition, the first surface treatment process may also be conducive to preventing the first-layer electrode 201 from being peeled off from a conductive layer formed on the surface in a subsequent process. Therefore, the first surface treatment process may be conducive to effectively reducing the roughness of the bottom electrode, thereby facilitating the improvement of the reliability of the formed capacitor device.

Figure 5:
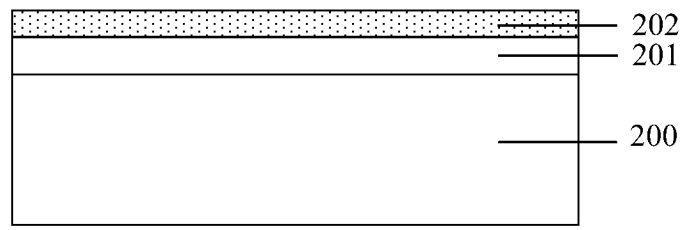

Further, returning to FIG. 10, a conductive layer having a second roughness that is smaller than the first roughness may be formed on the surface of the first-layer electrode (S404). FIG. 5 illustrates a schematic cross-sectional view of a semiconductor structure consistent with various embodiments of the present disclosure.

Referring to FIG. 5, a conductive layer 202 may be formed on the surface of the first-layer electrode 201, and the conductive layer 202 may have a second roughness. The second roughness may be smaller than the first roughness.

By depositing the conductive layer 202 with a second roughness smaller than the first roughness on the first-layer electrode 201, the roughness of the surface of the first-layer electrode 201 and the conductive layer 202 formed on the first-layer electrode 201 may be effectively reduced. That is, the roughness of the surface of the bottom electrode may be effectively reduced. The disclosed method may thus effectively reduce the presence of protrusions on the top surface of the bottom electrode. As such, the strength of the electric field generated between the bottom electrode and the top electrode may be effectively reduced. Therefore, the breakdown electric voltage of the capacitor device may be improved, and leakage current may be avoided, which may be conducive to improving the reliability of the formed capacitor device.

The conductive layer 202 may be made of a metal, including one or more of copper, cobalt, nickel, titanium, tantalum, aluminum, tungsten, platinum, etc.

In one embodiment, the conductive layer 202 may be capable of self-planarization, which may be conducive to filling the gaps between protrusions of the first-layer electrode 201, and thus may be conducive to planarizing the roughness of the surface of the first-layer electrode 201 and ensuring a desired roughness for the formed conductive layer 202. As such, the reliability of the formed capacitor device may be improved.

The process of forming the conductive layer 202 may include a sputtering deposition process, an ion beam deposition process, an ion-beam assisted deposition process, and any appropriate deposition process.

In one embodiment, the process of forming the conductive layer 202 may be a sputtering deposition process. By using a sputtering deposition process to form the conductive layer 202, the conductive layer 202 may have desired uniformity, and the second roughness of the conductive layer 202 may be smaller than the first roughness of the first-layer electrode 201. That is, the formed conductive layer 202 may have desired flatness, such that the roughness of the surface of the first-layer electrode 201 and the conductive layer 202 formed on the first-layer electric 201 may be effectively reduced, and thus the reliability of the formed capacitor device may be improved. Moreover, forming the conductive layer 202 through a sputtering deposition process may lead to desired density of the conductive layer 202, which may be conducive to improving the reliability of the formed capacitor device.

The thickness of the conductive layer 202 may not be too larger or too small. For example, when the thickness of the conductive layer 202 is larger than 1000 Å, the overall thickness of the formed capacitor device may be too large, which is not conducive to the subsequent integration process. In addition, the metal material in the conductive layer with an overly large thickness may easily generate a metal-containing polymer during an etching process that is performed subsequently. Such a metal-containing polymer may not be easily removed, and may thus adversely affect the reliability of the device. When the thickness of the conductive layer 202 is smaller than 10 Å, the gaps between the protrusions of the first-layer electrode 201 located under the conductive layer 202 may still not be sufficiently filled, and thus a conductive layer with desired flatness may not be formed. Therefore, the reliability of the formed capacitor device may not be desired. Moreover, an overly small thickness of the conductive layer 202 may easily cause device to break down. Therefore, a leakage current may be generated and the reliability of the formed capacitor device may be undesired. In one embodiment, the thickness of the conductive layer 202 may be in a range of approximately 10 Å to 1000 Å.

Figure 6:
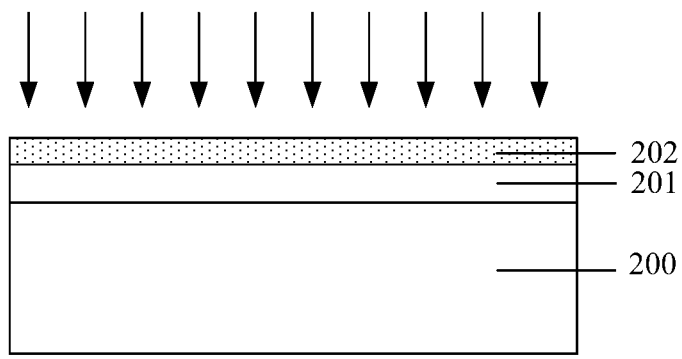

Further, returning to FIG. 10, after forming the conductive layer, a second surface treatment process may be performed on the conductive layer (S405). FIG. 6 illustrates a schematic cross-sectional view of a semiconductor structure consistent with various embodiments of the present disclosure.

Referring to FIG. 6, after forming the conductive layer 202, a second surface treatment process may be performed on the conductive layer 202. The second surface treatment process may be a reducing-gas treatment process. That is, during the second surface treatment process, a reducing gas may be used for treatment.

The reducing gas used in the reducing-gas treatment process may include one or a combination of hydrogen, carbon monoxide, hydrogen sulfide, methane, sulfur monoxide, etc. In one embodiment, the reducing gas may be hydrogen.

In one embodiment, when performing the second surface treatment process on the conductive layer 202, in the environment of the reducing gas, the conductive layer 202 may be prevented from being oxidized, and the conduction performance of the conductive layer 202 may thus be prevented from being degraded to cause a low capacitance density for the formed capacitor device. Therefore, the second surface treatment process may be conducive to improving the electrical performance of the formed capacitor device.

Figure 7:
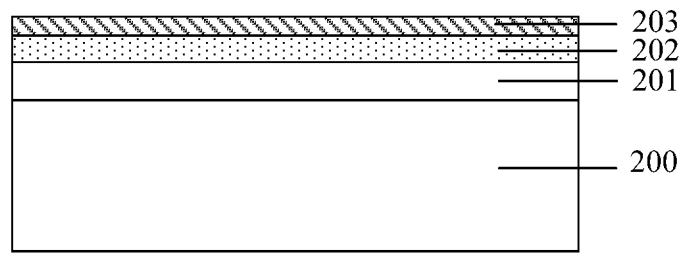

Further, returning to FIG. 10, a dielectric layer may be formed on the conductive layer (S406). FIG. 7 illustrates a schematic cross-sectional view of a semiconductor structure consistent with various embodiments of the present disclosure.

Referring to FIG. 7, a dielectric layer 203 may be formed on the surface of the conductive layer 202. In one embodiment, the dielectric layer 203 may be made of a high-k dielectric material (e.g., a material with a relative dielectric constant greater than 3.9). For example, the high-k dielectric material may include $HfO_2$, $La_2O_3$, HfSiON, $HfAlO_2$, $ZrO_2$, $Al_2O_3$, $HfSiO_4$, etc.

In one embodiment, the process of forming the dielectric layer 203 may include an ALD process, a PCVD process, a LPCVD process, a sputtering deposition process, an ion beam deposition process, or an ion-beam assisted deposition process.

In one embodiment, the thickness of dielectric layer 203 may not be too large or too small. For example, a thickness of the dielectric layer 203 greater than 200 Å may not be conducive to forming a capacitor device with a high capacitance density. However, when the thickness of the dielectric layer 203 is smaller than 10 Å, device breakdown may likely take place, such that a leakage current may be generated and the reliability of the formed capacitor device may be undesired. Therefore, in one embodiment, the thickness of the dielectric layer 203 may be in a range of approximately 10 Å to 200 Å.

Further, returning to FIG. 10, after forming the dielectric layer, a third surface treatment process may be performed (S407). FIG. 8 illustrates a schematic cross-sectional view of a semiconductor structure consistent with various embodiments of the present disclosure.

Referring to FIG. 8, after forming the dielectric layer 203, a third surface treatment process may be performed. Performing the third surface treatment process may include performing a cleaning process. The cleaning process may include one or a combination of a wet cleaning process and a dry cleaning process.

In one embodiment, the cleaning process may be a wet cleaning process. The process parameters of the wet cleaning process may include using deionized water, e.g., deionized water may be used for performing the wet cleaning process.

In one embodiment, the third surface treatment process may be performed on the dielectric layer 203, and after performing the wet cleaning process using deionized water, the impurities on the surface of the dielectric layer 203 may be effectively removed, which may prevent the surface of the dielectric layer 203 from being contaminated, thereby conducive to forming a dielectric layer 203 with stable performance. As such, the third surface treatment process may be further conducive to improving the reliability of the formed capacitor device.

Further, returning to FIG. 10, a second-layer electrode may be formed on the surface of the dielectric layer (S408). FIG. 9 illustrates a schematic cross-sectional view of a semiconductor structure consistent with various embodiments of the present disclosure.

Referring to FIG. 9, a second-layer electrode 204 may be formed on the surface of the dielectric layer 203. The second-layer electrode 204 may be made of a metal nitride, and the metal nitride may include titanium nitride, tantalum nitride, copper nitride, tungsten nitride, platinum nitride, aluminum nitride, nickel nitride, cobalt nitride, etc. In one embodiment, the second-layer electrode 204 may be made of titanium nitride.

In one embodiment, the process of forming the second-layer electrode 204 may include an ALD process, a PCVD process, a LPCVD process, a sputtering deposition process, an ion beam deposition process, or an ion-beam assisted deposition process.

The thickness of the second-layer electrode 204 may not be too large or too small. For example, when the thickness of the second-layer electrode 204 is larger than 1000 Å, the overall thickness of the formed capacitor device may be too large, which is not conducive to the subsequent integration process. However, when the thickness of the second-layer electrode 204 is smaller than 100 Å, device breakdown may likely take place, such that a leakage current may be generated and the reliability of the formed capacitor device may be undesired. Therefore, in one embodiment, the thickness of the second-layer electrode 204 may be in a range of approximately 100 Å to 1000 Å.

In one embodiment, after forming the second-layer electrode 204, the fabrication method may further include forming a plurality of conductive plugs in the first-layer electrode 201 and the second-layer electrode 204. The plurality of conductive plugs may be used to electrically connect devices that are formed in subsequent processes.

Accordingly, the present disclosure also provides a capacitor device. FIG. 9 illustrates a schematic cross-sectional view of an exemplary capacitor device consistent with various embodiments of the present disclosure.

Referring to FIG. 9, the capacitor device may include a substrate 200, a first-layer electrode 201 formed on the substrate 200, a conductive layer 202 formed on the surface of the first-layer electrode 201 and having a desired flatness, a dielectric layer 203 formed on the surface of the conductive layer 202, and a second-layer electrode 204 formed on the surface of the dielectric layer 203.

In one embodiment, the first-layer electrode 201 may be made of a metal nitride, and the second-layer electrode 204 may be made of a metal nitride. The metal nitride used for forming the first-layer electrode 201 may be the same as or different from the metal nitride used for forming the second-layer electrode 204. The metal nitride may include titanium nitride, tantalum nitride, copper nitride, tungsten nitride, platinum nitride, aluminum nitride, nickel nitride, cobalt nitride, etc.

In one embodiment, the thickness of the first-layer electrode 201 may be in a range of approximately 100 Å to 1000 Å, and the thickness of the second-layer electrode 204 may be in a range of approximately 100 Å to 1000 Å.

In one embodiment, the conductive layer 202 may be made of a metal or an alloy including one or more of copper, cobalt, nickel, titanium, tantalum, aluminum, tungsten, platinum, etc. The thickness of the conductive layer 202 may be in a range of approximately 10 Å to 1000 Å.

In one embodiment, the dielectric layer 203 may be made of a high-k dielectric material, and the thickness of the dielectric layer 203 may be in a range of approximately 10 Å to 200 Å.

According to the disclosed capacitor device, the conductive layer 202 is located on the first-layer electrode 201. The roughness of the first-layer electrode 201 is a first roughness, and the roughness of the conductive layer 202 is a second roughness. The second roughness is smaller than the first roughness, that is, the surface of the conductive layer 202 is smoother than the surface of the first-layer electrode 201. Therefore, for the first-layer electrode 201 and the conductive layer 202 formed on the first-layer electrode 201, the roughness of the surface may be reduced. That is, the roughness of the surface of the bottom electrode is effectively reduced, which is conducive to reducing the strength of the electric field generated between the bottom electrode and the top electrode. As such, the breakdown electric voltage of the capacitor device may be improved, and leakage current may be avoided. Therefore, the formed capacitor device may demonstrate desired reliability.

Compared to existing capacitor devices and fabrication methods, the disclosed capacitor device and fabrication method may demonstrate the following exemplary advantages.

According to the disclosed capacitor device and fabrication method, the roughness of the first-layer electrode is a first roughness, and a conductive layer having a second roughness is deposited on the first-layer electrode. The second roughness of the conductive layer is smaller than the first roughness of the first-layer electrode. Therefore, the roughness of the surface of the first-layer electrode and the conductive layer formed on the first-layer electrode is reduced. That is, the roughness of the bottom electrode of the capacitor device is reduced. The disclosed method may effectively reduce the presence of protrusions on the surface of the bottom electrode, such that the strength of the electric field generated between the bottom electrode and the top electrode may be effectively reduced. Therefore, the breakdown electric voltage of the capacitor device may be improved, and leakage current may be avoided. As such, the reliability of the formed capacitor device may be improved.

Further, the conductive layer is made of a metal, including copper, cobalt, nickel, titanium, tantalum, aluminum, tungsten, platinum, etc. The conductive layer is capable of self-planarization, and thus the conductive layer is able to sufficiently fill into the gaps between protrusions of the first-layer electrode, and thus may be conducive to planarizing the roughness of the surface of the first-layer electrode and ensuring a desired roughness for the formed conductive layer. As such, the reliability of the formed capacitor device may be improved Further, after forming the first-layer electrode and prior to forming the conductive layer, a first surface treatment process is performed on the surface of the first-layer electrode. Performing the first surface treatment process may be conducive to preventing the surface of the first-layer electrode from being contaminated. In addition, the first surface treatment process may also be conducive to preventing the first-layer electrode from being peeled off from a conductive layer formed on the surface of the first-layer electrode in a subsequent process. Therefore, the first surface treatment process may be conducive to improving the reliability of the formed capacitor device.

Further, after forming the conductive layer and prior to forming the dielectric layer, a second surface treatment process is performed on the conductive layer. Performing the second surface treatment process may be conducive to preventing the conductive layer from being oxidized, and thus may further be conducive to improving the reliability of the formed capacitor device.

Further, after forming the dielectric layer and prior to forming the second-layer electrode, a third surface treatment process is performed on the surface of the dielectric layer. Performing the third surface treatment process may be conducive to preventing the dielectric layer from being contaminated, and thus may be conducive to improving the reliability.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a capacitor device, comprising:
    providing a substrate;
    forming a first-layer electrode on the substrate, wherein a roughness of the first-layer electrode is a first roughness;
    after forming the first-layer electrode, performing a first surface treatment process on a surface of the first-layer electrode, wherein the first surface treatment process includes a wet cleaning process and a dry cleaning process, and an inert-gas treatment process after the wet cleaning process and the dry cleaning process;
    after performing the first surface treatment process on a surface of the first-layer electrode, forming a conductive layer directly on the first-layer electrode, wherein the first-layer electrode is directly sandwiched by the substrate and the conductive layer, the conductive layer is capable of self-planarization to fill into gaps between protrusions of the first-layer electrode, a roughness of the conductive layer is a second roughness, and the second roughness is smaller than the first roughness;
    after forming the conductive layer performing a second surface treatment process on a surface of the conductive layer;
    forming a dielectric layer on the conductive layer, wherein the second surface treatment process is performed before forming the dielectric layer and performing the second surface treatment process includes performing a reducing-gas treatment process, wherein a reducing gas used in the reducing-gas treatment process includes one or a combination of hydrogen, carbon monoxide, hydrogen sulfide, methane, and sulfur monoxide;
    performing a third surface treatment process on a surface of the dielectric layer, wherein performing the third surface treatment process includes: performing a cleaning process including a combination of a wet cleaning process and a dry cleaning process; and
    forming a second-layer electrode on the dielectric layer.

2. The method according to claim 1, wherein:
    the first-layer electrode is made of a first metal nitride;
    the second-layer electrode is made of a second metal nitride;
    a thickness of the first-layer electrode is in a range of approximately 100 Å to 1000 Å; and
    a thickness of the second-layer electrode is in a range of approximately 100 Å to 1000 Å.

3. The method according to claim 2, wherein:
    the first metal nitride includes one or more of titanium nitride, tantalum nitride, copper nitride, tungsten nitride, platinum nitride, aluminum nitride, nickel nitride, and cobalt nitride, and
    the second metal nitride includes one or more of titanium nitride, tantalum nitride, copper nitride, tungsten nitride, platinum nitride, aluminum nitride, nickel nitride, and cobalt nitride.

4. The method according to claim 1, wherein:
    a process of forming the first-layer electrode includes an atomic layer deposition (ALD) process, a plasma chemical vapor deposition (PCVD) process, a low-pressure chemical vapor deposition (LPCVD) process, a sputtering deposition process, an ion beam deposition process, or an ion-beam assisted deposition process; and
    a process of forming the second-layer electrode includes an ALD process, a PCVD process, a LPCVD process, a sputtering deposition process, an ion beam deposition process, or an ion-beam assisted deposition process.

5. The method according to claim 1, wherein:
    a thickness of the conductive layer is in a range of approximately 10 Å to 1000 Å.

6. The method according to claim 1, wherein:
    the conductive layer is made of a metal.

7. The method according to claim 6, wherein:
    the metal includes one or more of copper, cobalt, nickel, titanium, tantalum, aluminum, tungsten, and platinum.

8. The method according to claim 1, wherein:
    a process of forming the conductive layer includes a sputtering deposition process, an ion beam deposition process, or an ion-beam assisted deposition process.

9. The method according to claim 1, wherein:
    the dielectric layer is made of a high-k dielectric material; and
    a thickness of the dielectric layer is in a range of approximately 10 Å to 200 Å.

10. The method according to claim 1, wherein:
    a plurality of semiconductor devices is formed in the substrate.

11. The method according to claim 1, wherein:
    the second surface treatment process is performed on the surface of the conductive layer to prevent the conductive layer from being oxidized and prevent the capacitor device from degrading to a low capacitance density.

* * * * *